US010386551B2

(12) United States Patent
Landrock et al.

(10) Patent No.: US 10,386,551 B2
(45) Date of Patent: Aug. 20, 2019

(54) NANOSTRUCTURE ARRAY DIFFRACTIVE OPTICS FOR MOTION AND ANIMATION DISPLAY

(71) Applicant: IDIT TECHNOLOGIES CORP., Burnaby (CA)

(72) Inventors: Clinton K. Landrock, North Vancouver (CA); Badr Omrane, Burnaby (CA); Yindar Chuo, Burnaby (CA)

(73) Assignee: NANOTECH SECURITY CORP., Burnaby, British Columbia (CA)

( * ) Notice: Subject to any disclaimer, the term of this patent is extended or adjusted under 35 U.S.C. 154(b) by 0 days.

(21) Appl. No.: 14/889,815

(22) PCT Filed: May 9, 2014

(86) PCT No.: PCT/CA2014/050443
§ 371 (c)(1),
(2) Date: Nov. 6, 2015

(87) PCT Pub. No.: WO2014/179891
PCT Pub. Date: Nov. 13, 2014

(65) Prior Publication Data
US 2016/0116649 A1   Apr. 28, 2016

Related U.S. Application Data

(60) Provisional application No. 61/821,714, filed on May 9, 2013, provisional application No. 61/822,166, filed on May 10, 2013.

(51) Int. Cl.
*G02B 5/18* (2006.01)
*B42D 25/405* (2014.01)
*B42D 25/30* (2014.01)
*B42D 25/328* (2014.01)
*H01J 37/317* (2006.01)
*B82Y 20/00* (2011.01)

(52) U.S. Cl.
CPC .......... *G02B 5/1842* (2013.01); *B42D 25/30* (2014.10); *B42D 25/328* (2014.10);
(Continued)

(58) Field of Classification Search
CPC .. G02B 5/1809; G02B 5/1842; G02B 5/1823; G02B 5/1819; G02B 5/1828;
(Continued)

(56) References Cited

U.S. PATENT DOCUMENTS 5,784,200 A * 7/1998 Modegi ................ G02B 5/1847
359/2
8,593,595 B2    11/2013 Park et al.
(Continued)

OTHER PUBLICATIONS

Kumar et al., Printing colour at the optical diffraction limit, Aug. 12, 2012, Nature Nanotechnology vol. 7, pp. 557-561.*

*Primary Examiner* — Kimberly N. Kakalec
(74) *Attorney, Agent, or Firm* — Palmer IP Inc.

(57) ABSTRACT

A motion and animation display is disclosed, including multiple nanostructure arrays oriented at differing relative angles of rotation corresponding to multiple frames of an animation image, wherein the multiple nanostructure arrays are formed on a single substrate layer. An optical display device is also disclosed, including a substrate having a surface, a first frame of an animated image comprising a first optical sub-wavelength nanostructure array formed on or in the surface of the substrate, and a second frame of an animated image comprising a second optical sub-wavelength nanostructure array formed on or in the surface of the substrate, where the second nanostructure array is rotated relative to the first nanostructure array by a first relative angle of rotation. A method of manufacturing a motion and animation display comprising multiple nanostructure arrays oriented at differing relative angles of rotation is also disclosed.

19 Claims, 7 Drawing Sheets

(52) U.S. Cl.
CPC ......... *B42D 25/405* (2014.10); *G02B 5/1809* (2013.01); *G02B 5/1819* (2013.01); *G02B 5/1823* (2013.01); *G02B 5/1828* (2013.01); *H01J 37/3174* (2013.01); *B82Y 20/00* (2013.01)

(58) Field of Classification Search
CPC .... B42D 25/328; B42D 25/30; B42D 25/405; H01J 37/3174; B82Y 20/00
USPC ........................................ 359/2, 567; 283/86
See application file for complete search history.

(56) References Cited

U.S. PATENT DOCUMENTS

| | | | |
|---|---|---|---|
| 2005/0270604 A1 | 12/2005 | Drinkwater | |
| 2006/0263539 A1* | 11/2006 | Argoitia | C09D 5/38 427/547 |
| 2008/0067801 A1* | 3/2008 | Schilling | B42D 25/342 283/72 |
| 2009/0091644 A1 | 4/2009 | Mackey | |
| 2009/0174944 A1* | 7/2009 | Yuasa | G02B 5/1857 359/566 |
| 2010/0071237 A1* | 3/2010 | Toda | G02B 5/1809 40/299.01 |
| 2010/0254007 A1* | 10/2010 | Toda | G02B 5/0221 359/567 |
| 2011/0007374 A1 | 1/2011 | Heim | |
| 2011/0069360 A1* | 3/2011 | Dichtl | G07D 7/0013 359/2 |
| 2012/0127547 A1* | 5/2012 | Gocho | B42D 25/324 359/2 |
| 2014/0092718 A1 | 4/2014 | Kumar et al. | |

* cited by examiner

NANOSTRUCTURE ARRAY DIFFRACTIVE OPTICS FOR MOTION AND ANIMATION DISPLAY

CROSS-REFERENCE TO RELATED APPLICATIONS

This application is related and claims priority to U.S. Provisional Patent Application Ser. No. 61/821,714 filed May 9, 2013, and to U.S. Provisional Patent Application Ser. No. 61/822,166 filed May 10, 2013, both of which are hereby incorporated herein by reference in their entirety.

TECHNICAL FIELD

The present invention relates generally to optical security displays, and more particularly to optical security motion and animation displays using nanostructure arrays, and methods for their manufacture and use.

BACKGROUND OF THE INVENTION

Diffraction Gratings

According to one aspect of the art, diffraction gratings are known which may consist of periodic structures which cause incident light to diffract. In such cases, diffraction may occur both in transmissive (e.g. prisms) or reflective (e.g. CDs and DVDs) modes, and such diffraction may be due to the transparency or reflective nature of the substrate which contains the periodic structure. In such case, the pitch or spacing of the periodic structures, which is typically known as the period of the grating, has an inverse effect on the dispersion angle.

In one such aspect according to the art, an array of nanoholes with periodicity in the visible spectrum ($\lambda$) and hole diameters smaller than $\lambda/2$ may also diffract light to create structural colors. In one such aspect, the physical configuration of the nano-features may define the intensity of the diffracted wavelengths which may be substantially higher than which may be obtained using more conventionally available micro-scale gratings. For any diffraction grating, the intensity of the maxima peaks, in transmission or reflection, increases as a function of the number of slits (N) over a given area, specifically increasing as $N^2$. The colors seen in the first order maxima peaks become more distinguishable leading too higher chromatic resolution—i.e. crisper and clearer defined colors. For example, a diffraction grating with a spacing of 500 nm will exhibit intensity four times that of a grating spaced at 1000 nm, while producing clearly defined color bars. Visually the nanoscale features appear brighter, especially noticeable in dimmer light, and their specific colors appear more solid as the viewing angle changes (i.e. less "rainbowing" of colors). Diffraction gratings split white light into multiple colors. The intensity (I) and chromatic resolution of the colors depend on the size and density of slits in a given area, in accordance with the relation:

$$I \propto \left[\sum_{p=1}^{N/2} \cos\left((2p-1)\pi \frac{d}{\lambda}\sin\theta\right)\right]^2$$

Due to their unique brilliant optical effects, these nanoscale gratings have been implemented in some applications to replace holograms such as for some security applications in some aspects known in the art.

Motion and Animation Displays

According to another aspect of the art, motion and animation optical displays are known which provide the appearance or illusion of motion using multiple frames of a similar or related image shown in different positions, and exposing one frame at a time to a viewer. In one such aspect, a shutter or grating layer may be moved over a second layer showing multiple overlapping frames interlayered with each other to show successive frames to a viewer, such as in a "scanimation" type shutter animation display. According to a further aspect of the art, one or more of diffraction grating secondary layers, polarization secondary layers, lenticular lenses, holographic interference patterns and/or light wave interference may be used to alternate or selectively view individual image frames in other motion or animation displays.

SUMMARY OF THE INVENTION

Certain features, aspects and examples disclosed herein are directed to motion and animation displays using nanostructure arrays, according to an embodiment of the present invention. Certain features, aspects and examples are further directed to a method of manufacturing motion and animation displays using nanostructure arrays, according to another embodiment of the present invention. Additional features, aspects and examples are discussed in more detail herein.

In accordance with a first aspect of the present invention, a motion and animation display is provided comprising multiple nanostructure arrays oriented at differing relative angles of rotation corresponding to multiple frames of an animation image, wherein the multiple nanostructure arrays are formed on a single substrate layer.

In another aspect of the invention, an optical display device is provided comprising a substrate having a surface, a first frame of an animated image comprising a first optical sub-wavelength nanostructure array formed on or in the surface of the substrate, and a second frame of an animated image comprising a second optical sub-wavelength nanostructure array formed on or in the surface of the substrate, where the second nanostructure array is rotated relative to the first nanostructure array by a first relative angle of rotation.

In a further complementary aspect of the invention, the optical display device may comprise an optical security device, and the animated image comprises optically visible features and is operable to visually authenticate an article comprising the optical security device. In another aspect, the optical display device may comprise a first nanostructure array operable to diffract an incident light source at a first viewable angle relative to the substrate, and a second nanostructure array operable to diffract an incident light source at a second viewable angle relative to the substrate, such that the first frame of the animated image is viewable at the first viewing angle and the second frame of the animated image is viewable at the second viewing angle. In yet another aspect of the invention, the optical display device comprises a first nanostructure array comprising a plurality of nanostructures arranged in a first periodic lattice, and a second nanostructure array comprising a plurality of nanostructures arranged in a second periodic lattice, where the second periodic lattice is rotated relative to the first periodic lattice by a first relative angle of rotation.

In accordance with an additional aspect of the present invention, a method of manufacturing a motion and animation display comprising multiple nanostructure arrays oriented at differing relative angles of rotation is provided.

In a particular aspect, a method of manufacturing an optical display device is provided, comprising providing a substrate comprising a surface, forming a first plurality of optical sub-wavelength nanostructure arrays on the substrate surface to form a first frame of an animated image, and forming a second plurality of optical sub-wavelength nanostructure arrays on said substrate surface to form a second frame of an animated image where the second nanostructure arrays are rotated relative to the first nanostructure arrays by a first relative angle of rotation.

In a complementary method of manufacturing an optical display device according to an aspect of the invention, forming the first and second pluralities of nanostructure arrays comprises one or more of printing, imprinting, embossing, stamping, molding, etching or inscribing the nanostructure arrays in or on the substrate surface.

Further embodiments and advantages of the present invention will become apparent when considering the drawings in conjunction with the detailed description.

BRIEF DESCRIPTION OF THE DRAWINGS

Motion and animation displays using nanostructure arrays and associated methods of manufacture according to the present invention will now be described with reference to the accompanying drawing figures, in which.

DETAILED DESCRIPTION OF SEVERAL EMBODIMENTS

Figure 1:
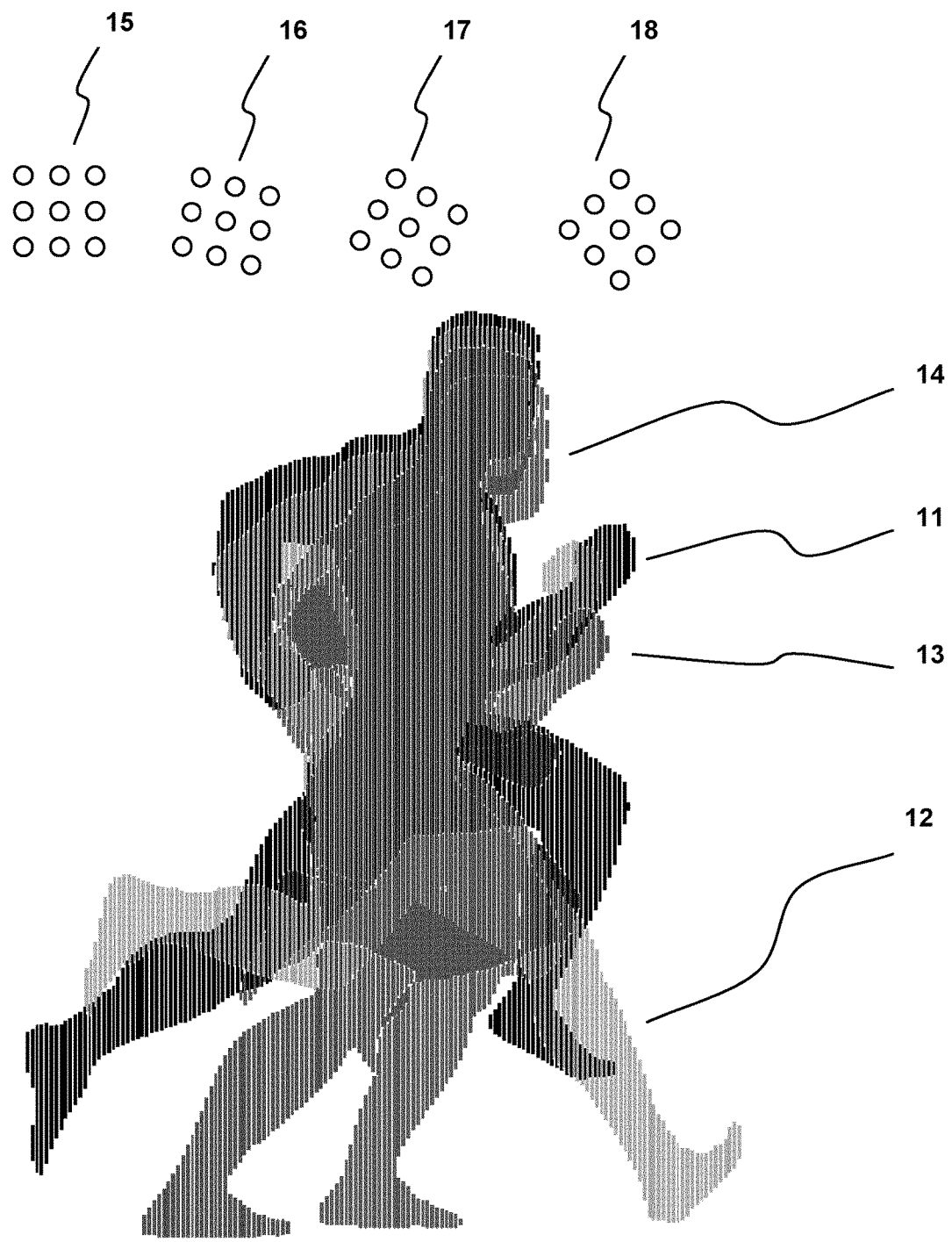
FIG. 1 illustrates a schematic view of an exemplary animation or motion display comprising multiple interleaved image frames, each frame comprising nanostructure arrays arranged at a predetermined rotational orientation relative to each other frame, according to an embodiment of the present invention.

Referring now to FIG. 1, a schematic view of an exemplary animation or motion display is shown comprising multiple interleaved image frames 11, 12, 13 and 14, each frame comprising nanostructure arrays such as representative corresponding nanohole arrays 15, 16, 17 and 18, arranged at a predetermined rotational orientation relative to each other frame, according to an embodiment of the present invention. In the exemplary four frame motion or animation display shown in FIG. 1, four image frames 11, 12, 13 and 14 are overlaid and/or interleaved with each other on a single layer substrate to form a composite interleaved image. Each of the exemplary four frames 11, 12, 13, 14 comprises nanostructure arrays formed on or in the substrate surface, where the corresponding nanostructure arrays representing each frame is oriented at a unique lattice angle relative to the other frames, to allow for only one of the four frames to be visible to a viewer at a particular viewing angle, due to the different angle of diffraction produced by the nanostructure arrays of each frame which diffract light at different viewing angles. For example, first frame 11 may comprise nanostructure arrays, such as exemplary nanohole arrays 15 oriented at a first relative lattice angle of 0 degrees. Second frame 12 may comprise nanostructure arrays, such as exemplary nanohole arrays 16 rotated at a second lattice angle such as 15 degrees relative to first arrays 15. Third frame 13 may comprise nanostructure arrays, such as exemplary nanohole arrays 17 rotated at a third lattice angle such as 30 degrees. Fourth frame 14 may comprise nanostructure arrays, such as exemplary nanohole arrays 18 rotated at a fourth lattice angle such as 45 degrees. Accordingly, in one embodiment, a motion or animation display may comprise multiple image frames overlaid and interleaved with each other on a single layer substrate surface, such as by separating each frame into fine lines (such as "slicing" into vertical lines) and interleaving each frame with the other frames to form a composite interleaved image on a single layer substrate surface, such as may be similar to the appearance of a design prepared for use with a "scanimation" multi-layer moving shutter animation system, wherein the animation or motion effect occurs in a single area of the substrate, such as in the case of the exemplary four frame animation of a running person such as is shown in FIG. 1. In an exemplary embodiment such as that shown in FIG. 1, each line of each frame may comprise nanohole arrays, such that all of the lines in a single frame are formed from nanohole arrays oriented at the same predetermined relative lattice rotational angle, and may therefore be seen at a particular predetermined viewing angle due to the diffraction effect of the predetermined lattice rotational angle. The rotational angle for each frame 11, is different relative to the rotation angle of the nanohole lattices of the other frames 12, 13, 14, so that the different diffractive angles resulting from each of the nanohole lattice angles results in only a single frame of the display being visible at a range of specific viewing angles by a viewer, while the other frames are not simultaneously visible. The viewer can then trigger or view the sequential animation or motion display by rotating the display or tilting the display left/right or up/down, such that the viewing angle changes, and each frame of the display can be individually sequentially viewed to form the motion or animation effect of the display—which in the exemplary display shown in FIG. 1 would appear to be a person running in place.

In one embodiment, all the nanostructure arrays of a single frame, or of all the frames in an exemplary animation or motion display may comprise a single periodicity and nanostructure size, so that the entire frame, or all of the frames appear in a single color to form a monochrome image. In another embodiment, the nanostructure arrays of different frames may have different periodicities and sizes so that different frames appear as different colors, or alternatively, each frame may comprise nanohole arrays having different specific periodicities and sizes chosen by a designer to provide different colors so as to allow for color imagery of each frame. In one such embodiment, the nanohole arrays of each frame may be arranged in subgroups or areas such as to define sub-images or pixels of an image, and the periodicity and size of the nanostructure arrays in each sub-image or pixel may be selected to define a particular color or brightness, so as to allow for complex color image representations of each frame in the animation or motion display.

In an embodiment of the present invention, the nanostructure arrays used to form each frame of an exemplary animation or motion display may comprise any suitable periodic nanostructure array that may be used to provide a diffractive effect on incident light, such as periodic sub-wavelength nanohole arrays, or periodic arrays of other nanostructures, such as but not limited to nano-columns, nano-bumps, nano-bosses, nano-indents, or other nanostructures which may be formed in a periodic nanostructure array on any suitable substrate surface, such as by nano-imprinting, embossing, machining, deposition or any other suitable nanostructure formation technique. Suitable substrates may comprise but are not limited to films, surfaces or layers of metallic, polymer, composite, cellulose, non-metallic or other suitable substrate materials, for example.

Figure 2:
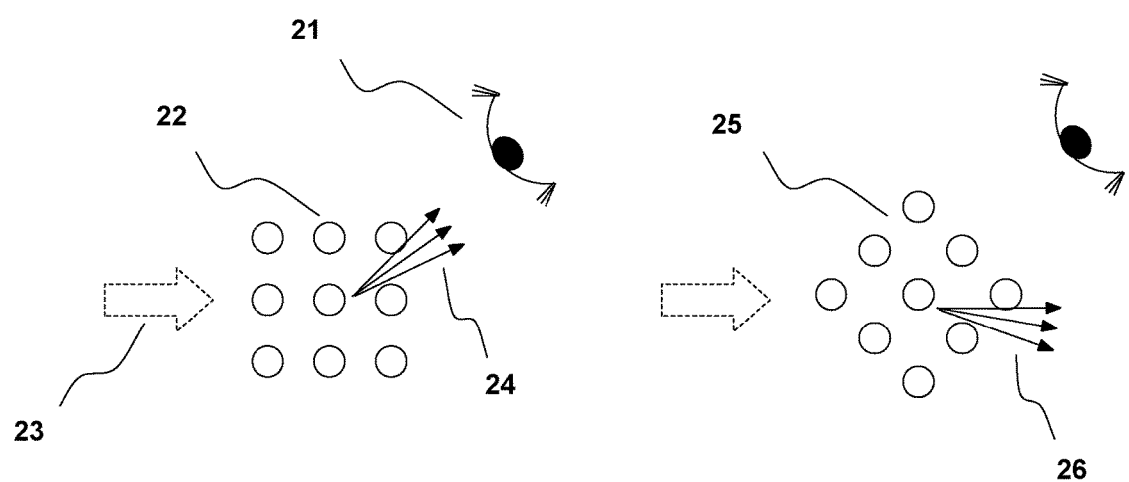
FIG. 2 illustrates a schematic view of exemplary nanostructure arrays for providing selective diffraction of incident light, according to an embodiment of the invention.

Referring now to FIG. 2, a schematic view of exemplary nanostructure arrays for providing selective diffraction of incident light is shown, according to an embodiment of the invention. An exemplary first nanostructure array, such as nanohole array 22, which is oriented at a first relative rotational angle, may act to diffract a diffuse incident light source 23, to form diffracted light 24 which is diffracted at a characteristic angle and viewable by a viewer or observer 21 at a particular viewing angle or range of viewing angles relative to the location of the nanohole array 22. An exemplary second nanostructure array, such as nanohole array 25 is oriented at a second relative rotational angle with respect to the first array 22, such that diffuse incident light is diffracted to form second diffracted light beam 26, which is diffracted at a different characteristic angle, and would not be viewable by the observer 21 at the same position as the diffracted light 24 from the first nanohole array 22. Therefore, similar to as is described above in reference to FIG. 1, the different relative rotational angles of the nanohole arrays 22 and 25 provide for selective viewability of the diffracted light from the nanohole arrays, depending on the position of an observer. In one embodiment of the invention such as shown in FIG. 1, this selective viewability allows for a viewer to view separate image frames comprising nanohole arrays rotated at different angles on a single substrate surface, such that each frame is separately and individually viewable in sequence as the viewer or observer rotates, or tilts the substrate to vary the relative viewing angle of the diffracted light coming from the nanohole arrays of each frame in sequence, such as to provide for motion or animation effects of the display In other embodiments, the incident diffuse light 23 may be diffracted and reflected and/or transmitted by the nanohole arrays forming the animation or motion display.

In a further embodiment of the invention, a motion or animation display according to an aspect of the invention may be applied as an optical security device comprising a substrate imprinted or embossed with sub-wavelength nanostructure arrays such as nanohole arrays, to create a motion or animation effect via diffraction of reflected or transmitted incident light that can be used to visually authenticate a separate entity or article (such as a document, currency, component or other security item) that may contain the substrate. An optical security device according to a particular embodiment may use specific sets of periodic sub-wavelength nanohole arrays to create bright diffractive based images that exhibit motion-like or animation effects when selectively and sequentially viewed by an observer. In one embodiment, the images may be multi-color or monochrome (single color). In another embodiment, rotating a finite nanohole array lattice angle may provide for control of the angle of diffracted light reflected or transmitted from the arrays, and thus the viewable angle of individual frames or portions of the imagery, can be tuned. In a further embodiment, sets of nanostructure arrays orientated at various rotations forming separate image frames may be used to create animations or simulated motion effects. In one such embodiment, an observer or viewer may activate the motion/animation effect(s) of the display by changing the viewing angle of an image consisting of such nanohole array sets, such as changing the viewing angle simply by rotating or tilting the display or substrate. In another embodiment, the nanohole arrays can be configured and treated as pixels that can be less than a micron in size, allowing for extremely high-resolution imagery to be produced. In one such embodiment, the diffraction characteristics and high resolution imagery that can be produced using sub-wavelength nanohole arrays are unique and therefore replication of these effects using any other technique would be expected to be difficult, if not improbable, making this technology highly suitable for security optics applications.

In one embodiment of the invention, exemplary nanostructure arrays used to form motion or animation displays may be configured such that the difference between rotational angles of adjacent image frames in an animation or motion sequence of the display are substantially equal, so that the animation or motion appears to move at substantially the same speed between image frames. In another exemplary embodiment, the arrays may be configured such that the difference between rotational angles of adjacent image frames in an animation or motion sequence of the display vary from frame to frame, so that the animation or motion appears to accelerate and/or decelerate between image frames, as may be desired to provide for more varied appearance of animation or motion effects of the display, for example.

Figure 3:
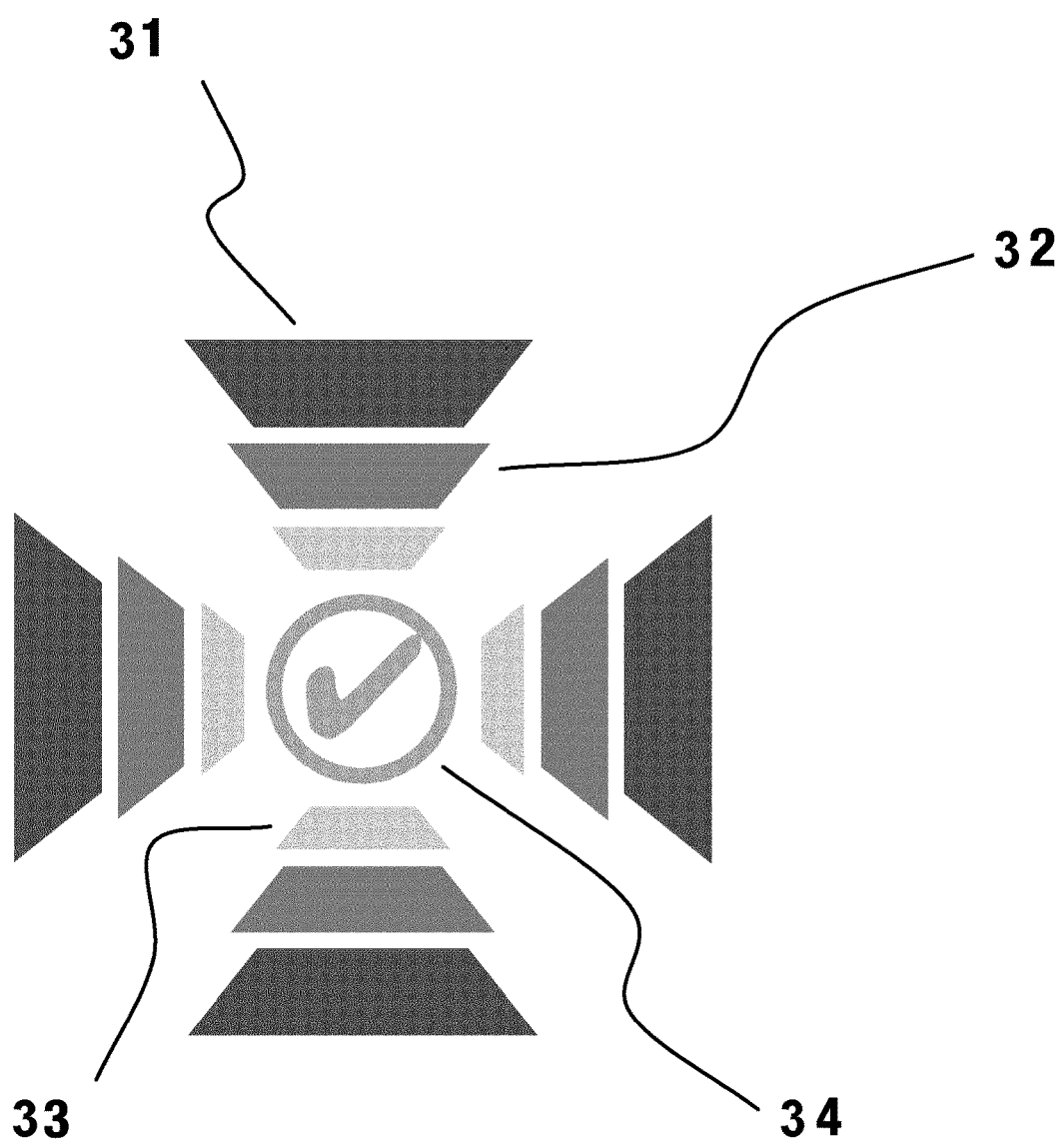
FIG. 3 illustrates a plan view of an exemplary animation or motion display comprising multiple adjacent image frames, each frame comprising nanostructure arrays arranged at a predetermined rotational orientation relative to each other frame, according to an embodiment of the invention.

Referring now to FIG. 3, a plan view of an exemplary animation or motion display comprising multiple adjacent image frames 31, 32, 33, 34, each frame comprising nanostructure arrays arranged at a predetermined rotational orientation relative to each other frame is shown, according to an embodiment of the invention. In the exemplary embodiment shown in FIG. 3, the four animation frames 31, 32, 33, 34 are arranged to simulate motion towards a vanishing point, and an exemplary central positive authentication indicia (check mark image 34), and are adjacent to each other and not overlaid or interleaved, so as to provide for a simulated motion effect moving toward the central area as the image frames 31, 32, 33, 34 are viewed individually in sequence. In the display shown in FIG. 3, each image frame 31, 32, 33, 34 may be configured from nanostructure arrays, such as nanohole arrays, with different unique nanostructure array lattice rotation angles. In a particular embodiment, each individual frame 31, 32, 33, 34 may also comprise nanostructure arrays having different unique periodicities and/or nanostructure sizes in addition to their different rotational angles, so as to provide for differences in at least one of the color, brightness, or quality of the image frame as viewed by a viewer, such as may be used to accentuate a motion or animation effect of the display, such as the lightening color of the concentric bars of frames 31, 32, 33, and the different color of the central indicia frame 34, for example. In one embodiment, the display of FIG. 3 may comprise square lattice nanohole arrays where frame 31 comprises nanohole arrays with a periodicity of 450 nm and a relative lattice rotational angle of 0 degrees; frame 32 comprises nanohole arrays with a periodicity of 470 nm and a relative lattice rotational angle of 10 degrees; frame 33 comprises nanohole arrays with a periodicity of 480 nm and a relative lattice rotational angle of 20 degrees; and frame 34 comprises nanohole arrays with a periodicity of 500 nm and a relative lattice rotational angle of 30 degrees, for example.

Figure 4:
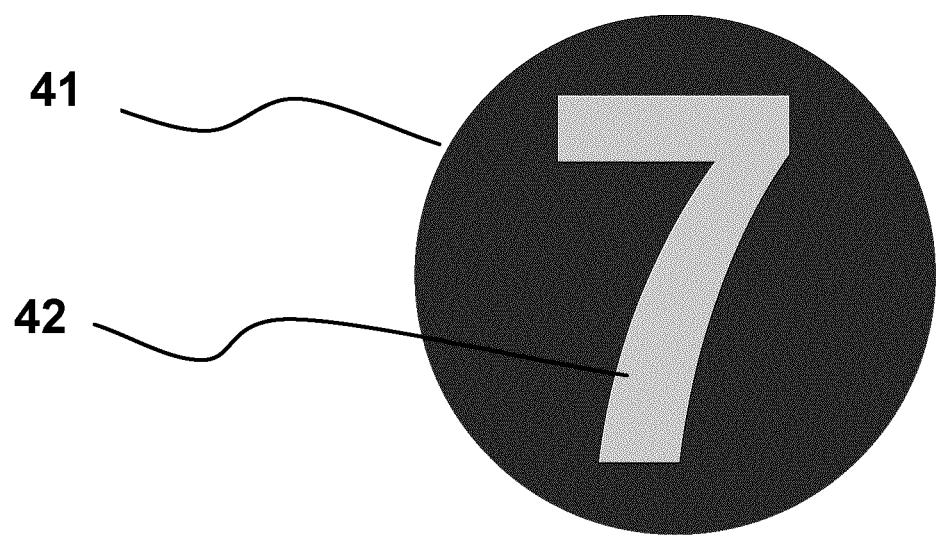
FIG. 4 illustrates a plan view of an exemplary two frame animation or motion display comprising overlaid image frames, each frame comprising nanostructure arrays arranged at a predetermined rotational orientation relative to each other frame, according to an embodiment of the invention.

Referring now to FIG. 4, a plan view of an exemplary two frame animation or motion display comprising overlaid image frames, each frame comprising nanostructure arrays arranged at a predetermined rotational orientation relative to each other frame is shown, according to an embodiment of the invention. In one embodiment, the two frame motion or animation display comprises a first frame 41 showing a blank circle, and a second frame 42 showing an indicia or symbol (such as the exemplary number 7). In one such embodiment, the relative rotation angles of the frames may be selected so that they may absorb light and appear dark at all but a limited desired viewing angle represented by the second frame 42, for example. In one such embodiment, when the substrate comprising the display is rotated or tilted to a predetermined angle, the nanohole arrays of the display will reflect diffracted incident light to reveal the desired hidden image or indicia, such as the indicia of second frame 42. In another embodiment, selection of appropriate periodicity of the nanohole arrays may also allow use of such a two frame display to light up or color a shadow image, for example. In a particular embodiment, the display of FIG. 4 may comprise nanohole arrays where frame 41 comprises nanohole arrays with a periodicity of 600 nm and a relative lattice rotational angle of 45 degrees and frame 42 comprises nanohole arrays with a periodicity of 450 nm and a relative lattice rotational angle of 45 degrees.

Figure 5:
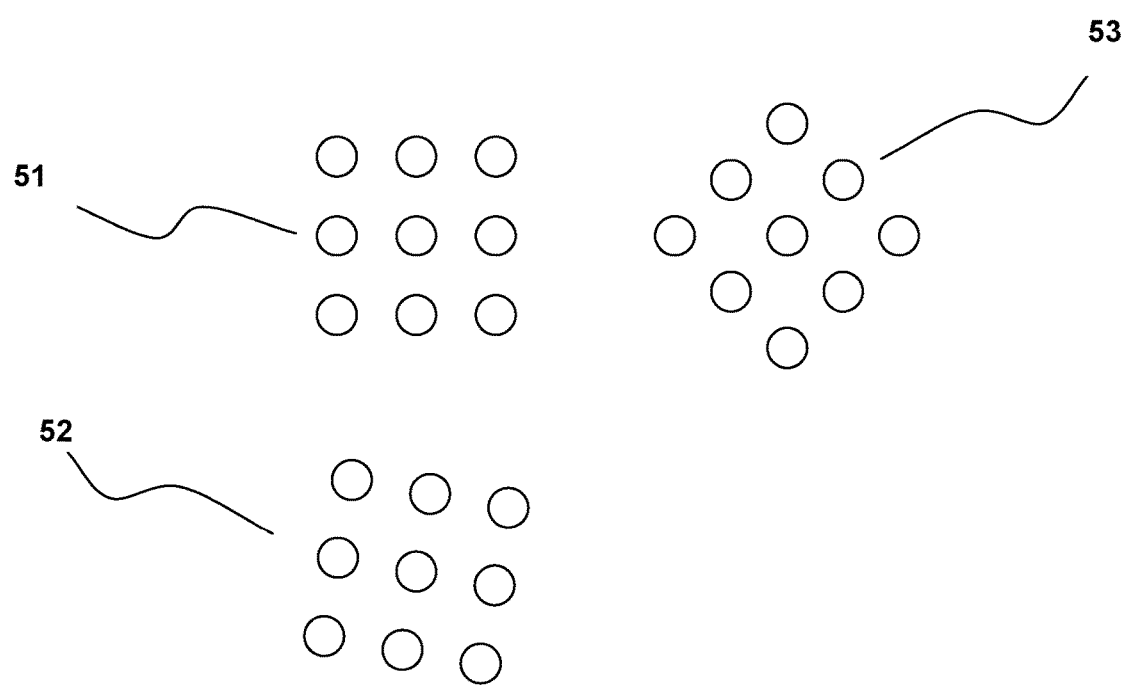
FIG. 5 illustrates a schematic view of exemplary square lattice nanostructure arrays for providing selective diffraction of incident light at different rotational angles, according to an exemplary embodiment of the invention.

Referring now to FIG. 5, a schematic view of exemplary square lattice nanostructure arrays for providing selective diffraction of incident light at different rotational angles is shown, according to an exemplary embodiment of the invention. In the exemplary embodiment illustrated, the square lattice nanostructure arrays may comprise square lattice nanohole arrays 51, 52, 53, where array 51 is oriented at a relative lattice rotation angle of 0 degrees; array 52 is oriented at a relative lattice rotation angle of 10 degrees; and array 53 is oriented at a relative lattice rotation angle of 45 degrees, for example.

Figure 6:
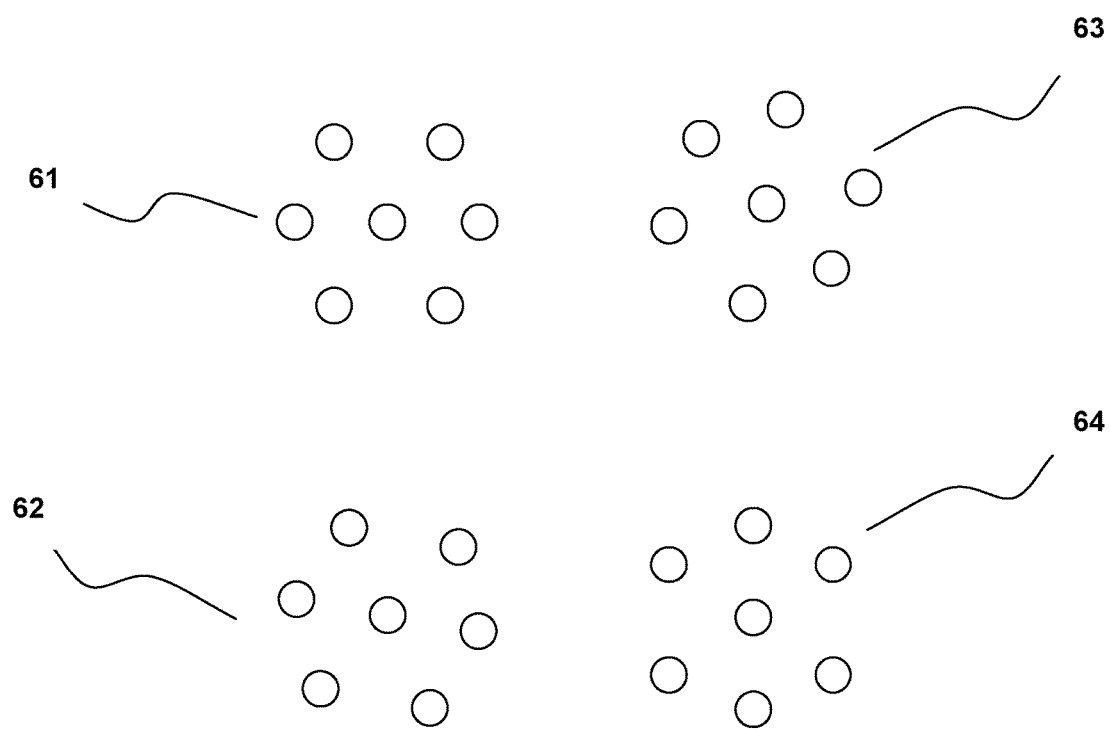
FIG. 6 illustrates a schematic view exemplary hexagonal lattice nanostructure arrays for providing selective diffraction of incident light at different rotational angles, according to an exemplary embodiment of the invention.

Referring now to FIG. 6, a schematic view exemplary hexagonal lattice nanostructure arrays for providing selective diffraction of incident light at different rotational angles is shown, according to an exemplary embodiment of the invention. In the exemplary embodiment illustrated, the hexagonal lattice nanostructure arrays may comprise hexagonal lattice nanohole arrays 61, 62, 63, 64 where array 61 is oriented at a relative lattice rotation angle of 0 degrees; array 62 is oriented at a relative lattice rotation angle of 10 degrees; array 63 is oriented at a relative lattice rotation angle of 45 degrees, and array 64 is oriented at a relative lattice rotational angle of 90 degrees, for example.

In one embodiment of the invention, a motion or animation display may comprise nanostructure arrays arranged in arrays having lattice configurations comprising at least one of: square, hexagonal, octagonal, pentagonal, or penrose semi-ordered lattice geometries. In another embodiment, the nanostructure arrays may be arranged in one or more other suitable lattice geometries.

In a further embodiment of the invention, a motion or animation display may comprise nanostructure arrays comprising nanoholes, where the geometry of the nanoholes comprising the array are selected from one or more of circular, substantially round, elliptical, rectangular, triangular or square hole geometries. In another embodiment, the nanoholes of the nanostructure arrays may be shaped in one or more other suitable hole geometries.

Figure 7:
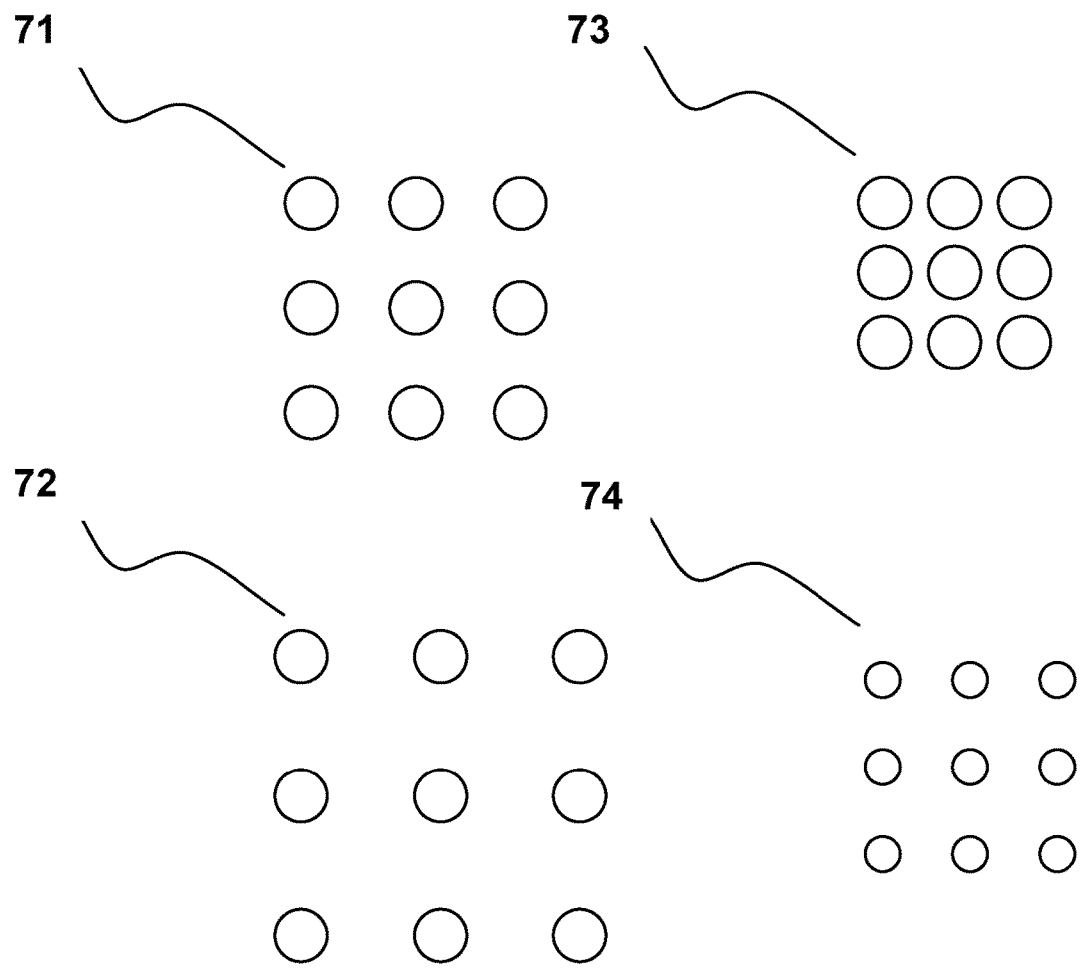
FIG. 7 illustrates a schematic view of exemplary square lattice nanostructure arrays having varying nanostructure size and periodicity according to an embodiment of the invention.

Referring now to FIG. 7, a schematic view of exemplary square lattice nanostructure arrays having varying nanostructure size and periodicity is shown, according to an embodiment of the invention. In one embodiment, a motion of animation display according to the invention may comprise one or more exemplary nanostructure array configurations, such as exemplary square lattice nanohole arrays 71, 72, 73 and 74. In a particular embodiment, array 71 may comprise a typically average spaced and sized square lattice nanohole array; array 72 may comprise a widely spaced square lattice nanohole array; array 73 may comprise a narrowly spaced or densely packed square lattice nanohole array; and array 74 may comprise an average spaced square lattice nanohole array having smaller sized nanoholes. In one embodiment, the spacing or periodicity of a nanohole array may be selected to determine a primary wavelength of light which may be preferentially reflected and/or transmitted by the nanohole array. In another embodiment, the size of the nanoholes in an array may be selected to determine the relative brightness of the light which may be preferentially reflected and/or transmitted by the nanohole array, and/or the bandwidth or range of wavelengths which may be preferentially reflected and/or transmitted by the nanohole array, for example.

In another embodiment of the invention, an optical security device may be provided comprising a single layer substrate imprinted or embossed with sub-wavelength nanohole arrays to create a motion or animation effect via diffraction of reflected or transmitted incident light that can be used to visually authenticate a separate entity that may contain said substrate. In a further such embodiment of the invention, an optical security device may also comprise at least two sets of nanohole arrays which each exhibit different relative lattice rotation angles around a common axis and at least one pre-defined periodic spacing (periodicity) between the holes of the arrays. In yet a further such embodiment, an optical security device may also comprise at least two sets of nanohole arrays that exhibit at least two different periodicities for producing at least two corresponding first order diffractive colors. In another such embodiment, an optical security device may also comprise nanohole arrays exhibiting at least one periodic array lattice type selected from the list comprising: square, hexagonal octagonal, and penrose semi-ordered lattices. In yet another such embodiment, an optical security device may also comprise nanohole arrays with at least one specified hole geometry selected from the list comprising: circles, ellipses, rectangles, squares and triangles.

In one embodiment of the present invention, an optical security device may be provided that comprises at least two images overlaid and/or interleaved (such as shown in FIG. 1 for example) to create a multi-frame animation or motion-like display or effect. In one such embodiment, each image frame may comprise a set of nanohole arrays oriented at at least one unique angle of lattice rotation for each image frame.

In another embodiment, an optical security device may be provided that comprises at least two images separate from, and substantially not overlapping or overlaid onto, each other (such as shown in FIG. 3 for example), to create at least two separate frames of a multi-frame animation or motion-like display or effect. In one such embodiment, each image frame may comprise a set of nanohole arrays oriented with at least one unique lattice rotation angle for each image frame.

In another embodiment, an optical security device may be provided that comprises at least two images (such as shown in FIG. 4 for example) to create a multi-frame animation or motion-like display or effect revealing a hidden image or indicia depending on a viewing angle of an observer. In one such embodiment, each image frame may comprise nanohole arrays having substantially similar or the same lattice rotation angle, but a different periodicity such that the two image frames can be distinguished. In another such embodiment, the optical security device may additionally comprise at least two sets of nanohole arrays that comprise nanohole structures which desirably absorb incident light according to a diffractive property or specified law, thereby concealing at least one image at a specified set of viewing angles.

In a further embodiment of the present invention, a method for creating an optical security device is provided, wherein the method comprises: writing, mastering or otherwise creating sub-wavelength nanohole arrays on a shim or master substrate surface comprising at least two nanohole arrays having different relative lattice rotation angles suitable to provide selectively viewable image frames as part of a motion or animation display or effect. In one embodiment, the nanohole arrays may be created using electron beam lithography, or another suitable nanoscale writing technique and/or device. In another embodiment, the method additionally comprises printing, imprinting, embossing, stamping, molding, or otherwise forming that at least two nanohole arrays forming the image frames onto a suitable single layer substrate to form the optical security device.

The exemplary embodiments herein described, including what is described in the Abstract, are not intended to be exhaustive or to limit the scope of the invention to the precise forms disclosed. They are chosen and described to illustrate and explain the principles of the invention and its application and practical use to allow others skilled in the art to comprehend their teachings.

As will be apparent to those skilled in the art in light of the foregoing disclosure, various equivalent alterations and modifications are possible in the practice of this invention without departing from the scope of the disclosure.

Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment. Further, the described features, structures, or characteristics of the present disclosure may be combined in any suitable manner in one or more embodiments. In this Detailed Description, numerous specific details are provided for a thorough understanding of embodiments of the disclosure. One skilled in the relevant art will recognize, however, that the embodiments of the present disclosure can be practiced without one or more of the specific details, or with other methods, components, materials, and so forth. In other instances, well-known structures, materials, or operations are not shown or described in detail to avoid obscuring aspects of the present disclosure.

The scope of the present disclosure fully encompasses other embodiments and is to be limited, accordingly, by nothing other than the appended claims, wherein any reference to an element being made in the singular is intended to mean "one or more", and is not intended to mean "one and only one" unless explicitly so stated. All structural and functional equivalents to the elements of the above-described preferred embodiment and additional embodiments are hereby expressly incorporated by reference and are intended to be encompassed by the present claims. Moreover, no requirement exists for an apparatus or method to address each and every problem sought to be resolved by the present disclosure, for such to be encompassed by the present claims. Furthermore, no element, component, or method step in the present disclosure is intended to be dedicated to the public regardless of whether the element, component, or method step is explicitly recited in the claims. However, that various changes and modifications in form, material, work-piece, and fabrication material detail may be made, without departing from the spirit and scope of the present disclosure, as set forth in the appended claims, are also encompassed by the present disclosure.

What is claimed is:

1. An optical display device to display animation comprising a substrate having a surface, at least two frames of an animated color image, wherein a first frame of said at least two frames is composed of many pixels which contain the desired visual and complex color image information of said first frame;

wherein additional frames are composed of many pixels which contain the desired visual and color information of said additional animation frames;

wherein said visual and complex color image information comprises at least one of image, color, shape, size, saturation or contrast; and wherein said pixels of said first frame are comprised of nanostructure arrays, with each set of nanostructures having a periodic spacing corresponding to the diffraction of wavelengths of light to animate the visual and complex color image information of the specified animation frame, and each array having a unique geometry corresponding to the visual information of the animation frame, and each array set having a specified angle of rotation corresponding to a first viewing angle for said first animation frame, wherein said pixels of said additional frames are comprised of nanostructure arrays, with each set of nanostructures having a periodic spacing corresponding to the diffraction of wavelengths of light to animate the colour information of the specified animation frame, and each array having a unique geometry corresponding to the visual and complex color image information of the animation frame, and each array set having a specified angle of rotation corresponding to the additional viewing angle for said additional animation frame, wherein said nanostructure arrays each comprise a plurality of nanostructures and said nanostructures comprise one or more of either nano-holes or nano-columns formed on or in said surface of said substrate.

2. The optical display device according to claim 1, wherein said optical display device comprises an optical security device, and wherein said animated image comprises optically visible features and is operable to visually authenticate an article comprising said optical security device.

3. The optical display device according to claim 1, wherein said first nanostructure array is operable to diffract an incident light source at a first viewable angle relative to said substrate, and said additional nanostructure arrays are operable to diffract an incident light source at additional viewable angles relative to said substrate, such that said first frame of said animated image is viewable at said first viewing angle and said additional frames of said animated image are viewable at said additional viewing angles.

4. The optical display device according to claim 3, wherein said first and additional viewable angles are oriented in at least one of a horizontal and vertical plane with respect to said surface of said substrate, and may be viewed by at least one of horizontal rotation and vertical tilting of said surface of said substrate.

5. The optical display device according to claim 1, wherein said first nanostructure array comprises a plurality of nanostructures arranged in a first periodic lattice, and said additional nanostructure arrays comprise a plurality of nanostructures arranged in additional periodic lattices, wherein said additional periodic lattices are rotated relative to a previous periodic lattice by said relative angle of rotation.

6. The optical display device according to claim 5, wherein said first and additional periodic lattices each comprise one or more of a square, hexagonal, octagonal, pentagonal or Penrose lattice geometry.

7. The optical display device according to claim 1, wherein said first and additional frames of said animated image are overlaid on each other or interleaved with each other on said substrate.

8. The optical display device according to claim 1, wherein said first and second frames of said animated image are located separate from each other or adjacent to each other on said substrate.

9. The optical display device according to claim 1, wherein said first and second nanostructure arrays each comprise a plurality of optical sub-wavelength nanostructures embossed on or imprinted in the surface of said substrate.

10. The optical display device according to claim 1, wherein said second periodic spacing is different from said first periodic spacing, said first nanostructure array is operable to diffract an incident light source in a first diffractive color, and said second nanostructure array is operable to diffract an incident light source in a second diffractive color different from said first diffractive color.

11. The optical display device according to claim 10, wherein said specified relative angle of rotation comprises one or more of substantially 90, substantially 180 and substantially 360 degrees.

12. The optical display device according to claim 1, wherein said first frame of said animated image comprises a plurality of first optical sub-wavelength nanostructure arrays formed on the surface of said substrate, each first nanostructure array comprising a plurality of nanostructures, and further comprising a plurality of periodic spacings between said nanostructures in said plurality of first nanostructure arrays.

13. The optical display device according to claim 12, wherein each of said plurality of first optical sub-wavelength nanostructure arrays comprises a sub-image or pixel of said first frame of said animated image.

14. The optical display device according to claim 1, wherein said first and additional nanostructure arrays each comprise a plurality of nanoholes formed in said substrate, said nanoholes comprising one or more of a circular, substantially round, elliptical, rectangular, triangular or square geometry.

15. The optical display device according to claim 1, wherein said first periodic spacing between said nanostructures creates a first color, and wherein said additional periodic spacing creates an additional color.

16. A method of manufacturing an optical display device to display animation comprising:
  providing a substrate comprising a surface;
  forming at least two frames of an animated color image comprised of a plurality of pixels on said substrate surface;
  wherein said pixels are comprised of nanostructure arrays with each set of nanostructures having a periodic spacing corresponding to the diffraction of wavelengths of light to animate the visual and complex colour information of the specified animation frame;
  forming a unique geometry corresponding to the visual and complex color image information of the animation frame, and each array set having a specified angle of rotation corresponding to a first viewing angle for said first animation frame,
  forming additional frames comprised of nanostructure arrays, with each set of nanostructures having a periodic spacing corresponding to the diffraction of wavelengths of light to animate the color information of the specified animation frame, and each array having a unique geometry corresponding to the visual and complex color image information of the animation frame, and each array set having a specified angle of rotation corresponding to the additional viewing angle for said additional animation frame; and
  forming said nanostructure of a plurality of nanostructures and said nanostructures comprises one or more of either nano-holes or nano-columns formed on or in said surface of said substrate.

17. The method of manufacturing an optical display device according to claim 16, wherein forming said first and additional pluralities of nanostructure arrays comprises one or more of printing, imprinting, embossing, stamping, molding, etching or inscribing said nanostructure arrays in or on said substrate surface.

18. The method of manufacturing an optical display device according to claim 16, wherein forming said first and additional pluralities of nanostructure arrays comprises writing said first and second pluralities of nanostructure arrays by means of electron beam lithography.

19. The method of manufacturing an optical device according to claim 16, additionally comprising attaching said substrate to a security article as an optical security authentication device.

* * * * *